(12) United States Patent
Miller

(10) Patent No.: US 6,970,022 B1
(45) Date of Patent: Nov. 29, 2005

(54) CONTROLLED HYSTERESIS COMPARATOR WITH RAIL-TO-RAIL INPUT

(75) Inventor: Edward E. Miller, Beaverton, OR (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 76 days.

(21) Appl. No.: 10/665,920

(22) Filed: Sep. 18, 2003

(51) Int. Cl.[7] .............................................. H03K 5/22
(52) U.S. Cl. ...................... 327/77; 327/205; 327/206
(58) Field of Search ......................... 327/205, 77, 537, 327/407, 408, 63, 65, 66, 206, 207

(56) References Cited

U.S. PATENT DOCUMENTS

| | | | | |
|---|---|---|---|---|
| 4,258,272 A | * | 3/1981 | Huang .......................... 326/71 |
| 5,446,396 A | * | 8/1995 | Brehmer ....................... 327/66 |
| 6,229,346 B1 | * | 5/2001 | Milanese et al. ............. 327/65 |
| 6,229,350 B1 | * | 5/2001 | Ricon-Mora ................. 327/77 |

OTHER PUBLICATIONS

Hogervorst et al., "Design of Low-Voltage, Low-Power Operational Amplifier Cells," 1996, pp. 165-167.

* cited by examiner

Primary Examiner—Tuan T. Lam
Assistant Examiner—Hiep Nguyen

(57) ABSTRACT

Comparator circuits, including rail-to-rail comparator circuits, can implement inverter structures such as current-starved inverters to provide hysteresis to the comparator's output. For example, a current-starved inverter can have its input driven by the comparator output and add current to the currents produced by the comparator's input stage. The inverter current can be derived from bias sources used to bias the input stage of the comparator so that the inverter current can track the input stage bias currents.

11 Claims, 9 Drawing Sheets

Key To

_US 6,970,022 B1_

CONTROLLED HYSTERESIS COMPARATOR WITH RAIL-TO-RAIL INPUT

TECHNICAL FIELD

The present invention relates to integrated circuits, and particularly to comparator circuits providing hysteresis.

BACKGROUND

Comparators are a common type of circuit and particularly integrated circuit used in many applications. For example, many analog circuits utilize a comparator to compare two input voltages and produce an output voltage representing the sign of the net difference between the input voltages, e.g., a signal that is either high or low depending upon the relationship of the two input voltages. Thus, a comparator can be thought of as a one-bit analog-to-digital converter (ADC). Besides being key components of ADCs, comparators are also widely used in simple on-off controls circuits, clock-recovery circuits, window detectors, Schmitt triggers, and for level detection.

Moreover, comparators can be designed for a variety of different types of operation such as: single-ended operation where single-ended inputs are used for the two input voltages and the comparator produce a single-ended output; fully differential operation where both inputs are differential inputs, e.g., for use with fully differential analog circuits; and rail-to-rail operation where the comparator operates over a wide common mode input voltage range, e.g., from at or near the positive supply rail to at or near the negative supply rail of the device.

Regardless of the mode of operation, it is important for a comparator to function properly and to provide an output signal indicative of the input signals at the input of the comparator. Comparators are often based on differential amplifier circuits that can be subject to a variety of process related effects, temperature related effects, and topology effects that can cause the comparator to become unstable. For example, capacitive strays from the comparator output to one or both of its inputs and/or coupling of output currents to ground can cause the comparator to behave in an unintended manner. In general, any source of noise can complicate comparator operation. Thus, when processing time varying signals, particularly slowly varying signals, with small amounts of superimposed noise, comparators can produce multiple output transitions as the input crosses and recrosses the comparison threshold established by the circuit. Additionally, crossing the threshold region can lead to amplification of signal noise, thereby causing the comparator output to bounce back and forth between its defined output states.

One common solution to this problem is to provide feedback to the comparator in the form a small amount of hysteresis. This has the effect of separating the switching points in both directions, e.g., from low to high and from high to low, so that once a transition has started the input must undergo a significant reversal before the reverse transition can occur. Hysteresis is useful in situations where the signal is slow moving, or where an uncertain transition condition exists that would otherwise result in excessive noise on the comparator output.

Typical comparator hysteresis solutions provide feedback signals to one or both the comparator's inputs using feedback resistors, voltage dividers, or cross-coupled loads. These techniques can have a variety of drawbacks depending on the comparator implementation. For example, feedback resistors can consume valuable die space on integrated circuit implementations. Desired comparator performance, such as rail-to-rail operation, can also be negatively impacted by these hysteresis techniques. In still other examples, additional circuit components integrated along with the comparator, e.g., a digital to analog converter (DAC) used to provide a reference signal at one of the comparator inputs, may be adversely affected by the use of traditional hysteresis solutions.

Accordingly, it is desirable to have a comparator circuit that implements adequate hysteresis to avoid many of the operational problems associated with comparator use while also avoiding problems associated with traditional hysteresis implementations and allowing for proper integration into larger integrated circuits.

SUMMARY

It has been discovered that comparator circuits, including rail-to-rail comparator circuits, can implement inverter structures such as current-starved inverters to provide hysteresis to the comparator's output. For example, a current-starved inverter can have its input driven by the comparator output and add current to the currents produced by the comparator's input stage. The inverter current can be derived from bias sources used to bias the input stage of the comparator so that the inverter current can track the input stage bias currents.

Accordingly, one aspect of the present invention provides a circuit including an input stage, a summing stage, and a hysteresis transistor. The input stage includes a first pair of input transistors wherein each of the transistors of the first pair of input transistors is coupled to a corresponding input terminal. The input terminals are operable to receive respective input signals. The summing stage, coupled to the input stage and including an output terminal, is configured to receive a plurality of signals from the input stage. The hysteresis transistor includes a hysteresis transistor input terminal coupled to the output terminal of the summing stage. The hysteresis transistor is further coupled to at least one summing node of the summing stage. The hysteresis transistor is operable to supply a current to the at least one summing node based on an output signal supplied at the output terminal of the summing stage.

Another aspect of the present invention provides a method of providing hysteresis in a comparator circuit. A first transistor of a first type is controlled with an output signal of a comparator circuit. A second transistor of a second type is controlled with the output signal of the comparator circuit. An amount of current available to at least one of the first transistor of a first type and the second transistor of a second type is limited. An output current from at least one of the first transistor of a first type and the second transistor of a second type is applied to a summing node of the comparator circuit.

Still another aspect of the present invention provides another apparatus including: a means for amplifying the difference between a first input signal and a second input signal; a means for summing a plurality of output signals from the means for amplifying the difference between a first input signal and a second input signal; and a means for providing a hysteresis signal to the means for summing a plurality of output signals from the means for amplifying the difference between a first input signal and a second input signal.

Yet another aspect of the present invention provides a comparator including an input amplifier, a first current mirror, a second current mirror, a first hysteresis transistor, and a second hysteresis transistor. The input amplifier includes a first pair of input transistors having a first transistor type, each of the first pair of input transistors being coupled to a corresponding input terminal operable to receive a respective input signal. The input amplifier also includes a second pair of input transistors having a second transistor type, each of the second pair of input transistors being coupled to a respective one of the corresponding input terminals. The first current mirror is coupled to the first pair of input transistors and is operable to sum a first pair of input amplifier output signals and provide at least a portion of a comparator output signal on a comparator output terminal. The second current mirror is coupled to the second pair of input transistors and operable to sum a second pair of input amplifier output signals and provide at least another portion of the comparator output signal on the comparator output terminal. The first hysteresis transistor includes a first hysteresis transistor input terminal coupled to the comparator output terminal and operable to supply a first hysteresis current to at least one of the first current mirror and the second current mirror. The second hysteresis transistor includes a second hysteresis transistor input terminal coupled to the comparator output terminal and operable to supply a second hysteresis current to at least one of the first current mirror and the second current mirror.

The foregoing is a summary and thus contains, by necessity, simplifications, generalizations and omissions of detail; consequently, those skilled in the art will appreciate that the summary is illustrative only and is not intended to be in any way limiting of the invention. As will also be apparent to one of skill in the art, the operations disclosed herein may be implemented in a number of ways, and such changes and modifications may be made without departing from this invention and its broader aspects. Other aspects, inventive features, and advantages of the present invention, as defined solely by the claims, will become apparent in the non-limiting detailed description set forth below.

BRIEF DESCRIPTION OF THE DRAWINGS

A more complete understanding of the present invention and advantages thereof may be acquired by referring to the following description and the accompanying drawings, in which like reference numbers indicate like features.

DETAILED DESCRIPTION

The following description is intended to be illustrative of embodiments of the invention and should not be taken to be limiting.

The description below and the circuits illustrated in FIGS. 1–5 will generally focus on comparator designs that use single-ended inputs for the two input voltages and produce a single-ended output signal. Moreover, emphasis will be placed on comparator designs allowing for rail-to-rail input capability. However, the systems, methods, devices, and circuits described herein can be implemented in a variety of different comparator architectures. For example, comparators that do not support rail-to-rail input signals can be used. Additionally, fully differential comparators, where both inputs are differential inputs, can make use of the circuits and techniques presently described. Those having ordinary skill in the art will recognize a variety of different comparator implementations in keeping with the present description.

Figure 1:
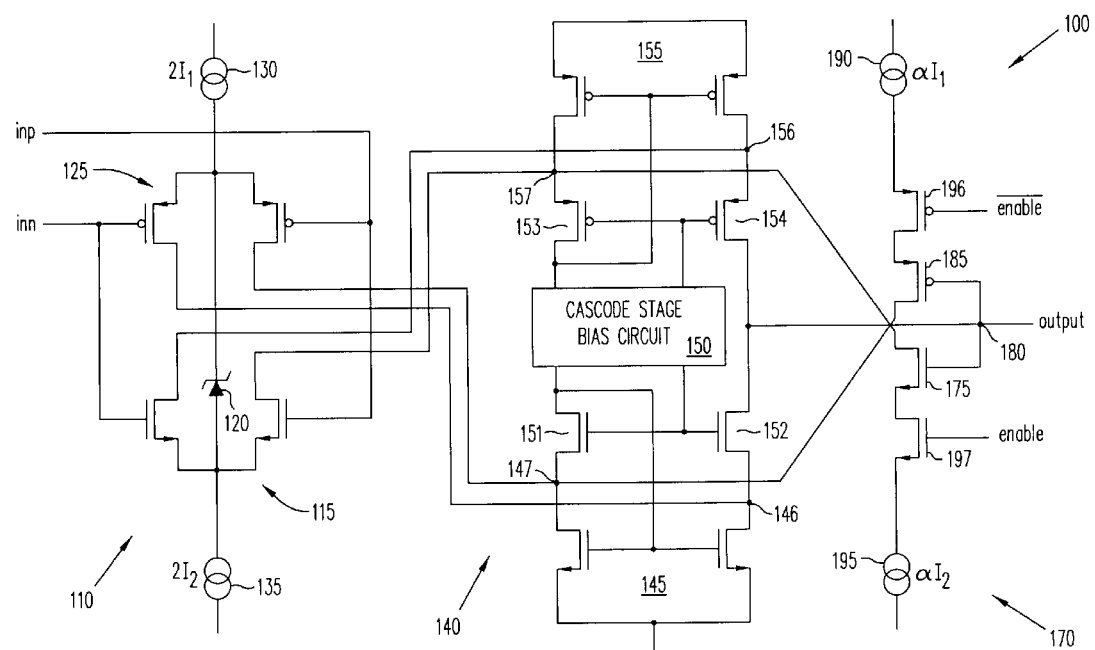
FIG. 1 illustrates a simplified schematic diagram of a rail-to-rail input comparator including circuitry for providing hysteresis according to one embodiment of the invention.
Figure 2A:
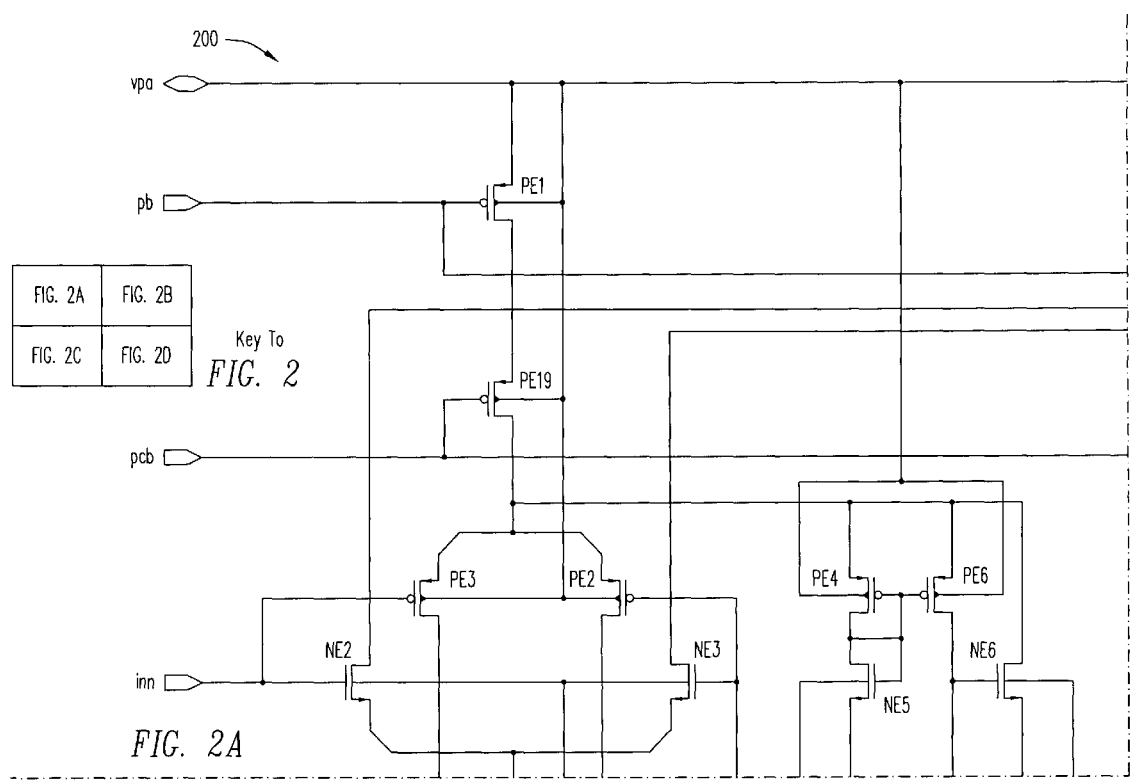
FIG. 2 (shown as FIGS. 2A–2D) illustrate a more detailed schematic diagram of a rail-to-rail input comparator including circuitry for providing hysteresis.
Figure 2B:
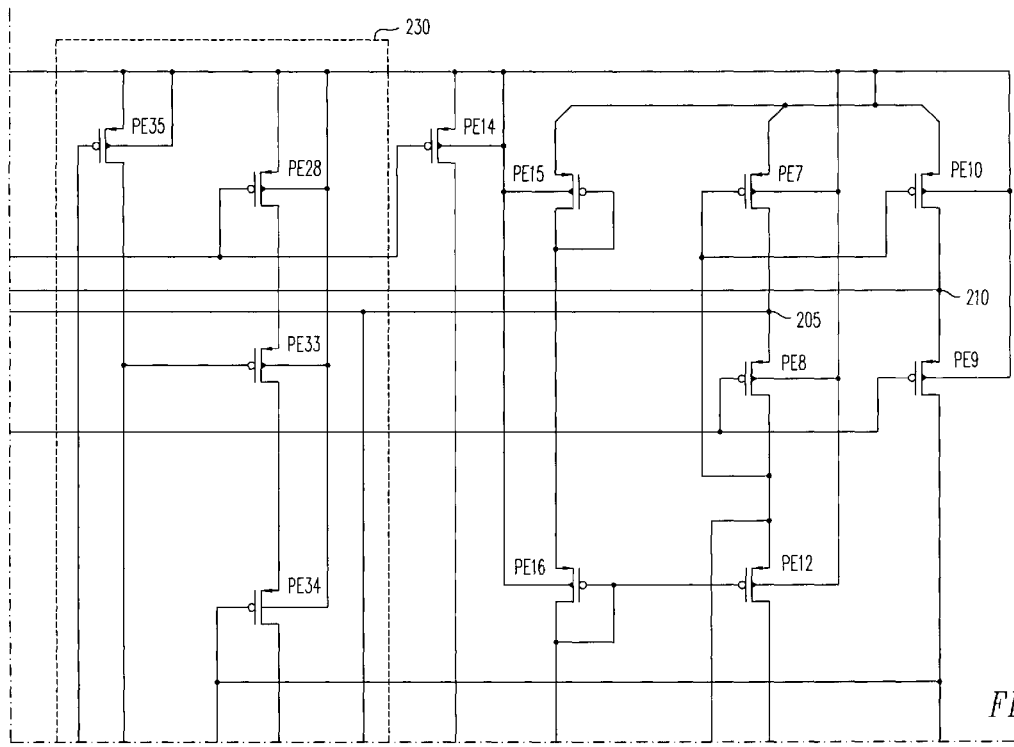
Figure 2C:
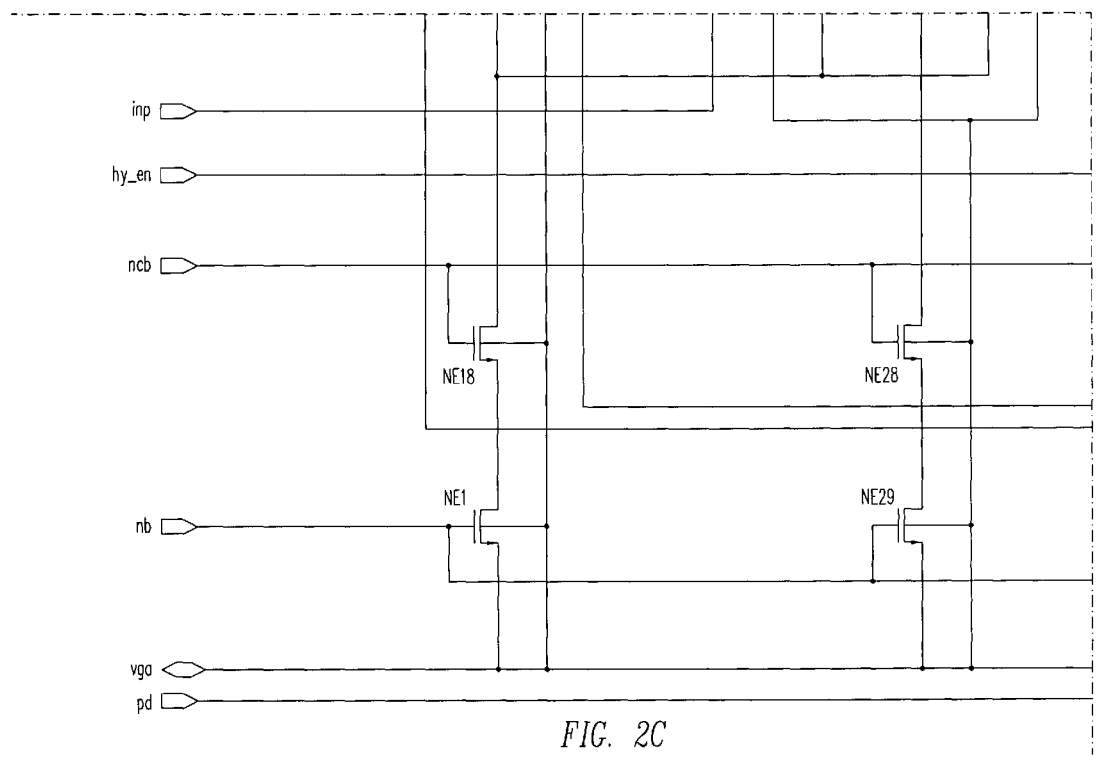
Figure 2D:
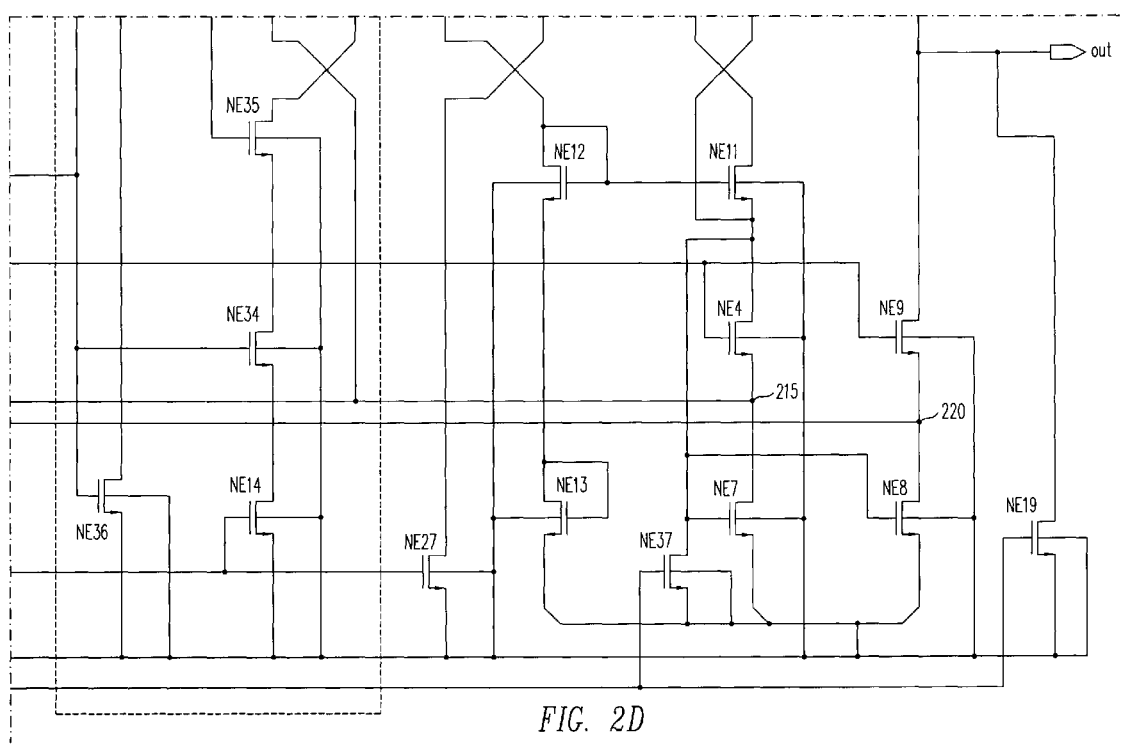

FIG. 1 illustrates a simplified schematic diagram of a rail-to-rail input comparator 100 including circuitry for providing hysteresis. Rail-to-rail input comparator 100 includes three main sections: rail-to-rail input stage 110, summing stage 140, and hysteresis feedback stage 170.

Rail-to-rail input stage 110 is a differential amplifying stage formed from a PMOS transistor input pair 125 and an NMOS transistor input pair 115. Each of the two input signals inp (representing the "positive" input signal having a positive voltage with respect to the other input signal) and inn (representing the "negative" input signal having a voltage negative with respect to the other input signal) drive a gate of a transistor in each of the two differential input pairs, thereby processing the input signals from rail to rail.

As generally represented by zener diode 120, one or more circuit elements are used to control rail-to-rail input stage 110 as needed in an effort to keep the transconductance as a function of the common-mode input voltage constant. Without some type of transconductance control, the transconductance of the input stage can be a factor of two larger in the middle of the common-mode range (where both PMOS transistor input pair 125 and NMOS transistor input pair 115 are operating) than in the other parts of the common-mode range when only pair or the other is operating. Since the transconductance of CMOS transistors operating in moderate to strong inversion is proportional to the gate-source voltage, constant transconductance can be obtained by regulating the sum of the gate-source voltages of the PMOS input pair 125 and NMOS input pair 115 so that that sum remains constant. One structure used to accomplish this is the so-called "electronic" zener diode. Still other techniques and circuits useful for maintaining constant transconductance in a rail-to-rail input stage, e.g., circuits for keeping the sum of the currents through NMOS and PMOS pairs constant, circuits for keeping the sum of the square roots of the currents through NMOS and PMOS pairs constant, current switches used to change the tail current of the input differential pairs, and DC level shifting circuits to shift DC input level, can be implemented depending on the comparator topology and other design constraints, as is well known in the art.

To accommodate the design of rail-to-rail input stage 110, summing stage 140 includes two current mirrors 145 and 155 with cascode devices 151, 152, 153, and 154 and bias circuitry 150. The PMOS current mirror currents are generally set by the bias voltage at the gates of cascode devices 153 and 154 as controlled by cascode stage bias circuit 150. Similarly, the NMOS current mirror currents are generally set by the bias voltage at the gates of cascode devices 151 and 152 as controlled by bias circuit 150. The drain current of cascode device 153 is passed through the bias circuit 150 to cascode device 151 without disturbing the current mirror gate biases. The bias voltage and currents for PMOS current mirror 155 are established by the PMOS cascode gate bias voltage and by the current from the NMOS input pair to node 157, which is subtracted from the current of the left PMOS current mirror device, thereby establishing the current in cascode device 153. Ignoring the currents from the PMOS input pair 125 for the moment, the current in cascode device 153 defines the current in cascode device 151 and therefore the current in the NMOS current mirror 145. The current from NMOS input pair 115 to node 156 establishes the net current in cascode device 154. Similarly, the PMOS input pair 125 subtract currents from that which would be available for cascode device 151 to set the current in NMOS current mirror 145 and to establish the net current in cascode device 152. The difference of the currents in cascode device 152 and cascode device 154 drives the comparator output node 180.

Input voltage changes affect the current mirrors in the following manner. If the voltage at input inn moves lower, then the current taken from node 157 by the NMOS input pair increases, which reduces the current to cascode device 153 and causes a compensating increase in currents in the PMOS current mirror 155. Since the current taken from node 156 decreases as the current taken from node 157 increases, the current in cascode device 154 increases. At the NMOS current mirror 145, the current taken from node 147 by the PMOS input pair 125 decreases, so the current in cascode device 151 increases and the NMOS current mirror 145 has reduced currents. Since cascode devices 153 and 151 must have the same currents, both current mirror gate voltages float to re-adjust their currents to equalize the currents in 153 and 151. The net effect, summing all these effects, is that cascode device 154 current increases and cascode device 152 current decreases, forcing the output node 180 to rise.

Hysteresis feedback stage 170 provides the desired amount of hysteresis to the comparator and is generally implemented as part of the rail-to-rail comparator integrated circuit. The basic structure of hysteresis feedback stage 170 utilizes a CMOS inverter formed from PMOS transistor 185 and NMOS transistor 175. The gates of both devices are coupled to the output node 180 of comparator 100 to provide a hysteresis feedback signal depending on the essentially binary output of the comparator. In a typical inverter, the output is the common node shared by the drains of PMOS transistor 185 and NMOS transistor 175. Although such a structure can be used in conjunction with other input stages and summing stage topologies, the typical implementation in conjunction with a rail-to-rail input stage such as stage 110 and a corresponding summing stage such as stage 140 has two outputs each tied to respective summing nodes as shown. In this manner, hysteresis is provided by adding appropriate currents to the differential input pair currents at the current mirror input nodes 157 and 147. Had the drains been tied to one node, either the PMOS or the NMOS transistor current would have been reduced due to improper biasing, resulting in an error in the hysteresis level. As will be described in greater detail below, these hysteresis currents are typically derived from the differential input pair bias sources so they track these bias currents. The hysteresis current added to the input pair currents introduces an equivalent offset at the input stage equal to the offset current divided by the input stage transconductance. Since the transconductance of input stage 110 is generally constant over the full input voltage range, the hysteresis is constant over the entire input range in spite of changing operating conditions, e.g., temperature, process variation, etc., in the rail-to-rail input stage.

Rail-to-rail input comparator 100 is designed so that the hysteresis can be optionally enabled or disabled. To that end, transistors 196 and 197 are inserted between transistors 185 and 175 and their respective current sources 190 and 195. When an enable signal is applied to transistor 197 and a complement signal applied to transistor 196, hysteresis feedback stage 170 is enabled to provide hysteresis current to the current mirrors. When disabled, no hysteresis current is provided.

Although PMOS transistor input pair 125 and an NMOS transistor input pair 115 are each illustrated as having separate current sources 130 and 135, they can be supplied current using a variety of different techniques. As shown, current source 130 provides a current $2I_1$ while current source 135 provides a current $2I_2$. Under typical operating conditions the values $I_1$ and $I_2$ are nominally equal. Thus, the currents provided to hysteresis feedback stage 170 are also nominally equal and hysteresis current at transistors 185 and 175 are equal in magnitude. In general, currents $I_1$ and $I_2$ are defined by a reference voltage and trimmed resistors (not shown) that are independent of other voltages at comparator 100 and independent of process parameters to at least the first order due to careful device trimming. Thus, the hysteresis can be provided independent of integrated circuit manufacturing process effect to at least the first order. Moreover, since it is useful to limit the current provided to transistors 185 and 175 and to keep the current well defined care must be taken in selecting the circuits implementing current sources 190 and 195. Thus in some embodiments, hysteresis feedback stage 170 uses current-starved inverter topologies to provide the desired hysteresis current. At least one example of such inverter topology is described in greater detail below.

FIG. 2 (shown as FIGS. 2A–2D) illustrate a more detailed schematic diagram of an example of a rail-to-rail input comparator including circuitry for providing hysteresis. As with rail-to-rail input comparator 100, comparator 200 includes circuitry implementing input stage functionality, summing stage functionality, and hysteresis feedback stage functionality.

Rail-to-rail input comparator 200 is based on a the rail-to-rail input operational amplifier. Transistors PE2 and PE3 form the PMOS differential input pair while transistors NE2 and NE3 form the NMOS differential input pair. The differential input pairs drive cascode current mirrors which are formed by PMOS devices PE7, PE8, PE9 and PE10 and by NMOS devices NE4, NE7, NE8 and NE9. Currents from the NMOS differential input pair feed into summing nodes of the PMOS current mirror at the nodes 205 and 210. These currents are added to the nominal drain currents of transistors PE7 and PE10. Currents from the PMOS differential input pair feed into the summing nodes of the NMOS current mirror at nodes 215 and 220. These currents are added to the nominal drain currents of transistors NE7 and NE8. Additionally, since the gate bias voltages at the cascode transistors PE8 and PE9, and equivalently transistors NE4 and NE9, are at fixed voltages, there is some reduction in the currents through the four cascode transistors. This current reduction can be considered a second-order effect but the net current at the output is not perturbed by this re-biasing.

Consequently, in one example of basic operation of the comparator 200 and ignoring-operation of the hysteresis stage, when input signals inn and inp are at equal voltages (or tied together) the currents in transistors PE2 and PE3 are equal. Similarly, the currents in transistors NE2 and NE3 are also equal. Thus, equal currents are added to the cascode current mirrors and there is no net current at the circuit output node (e.g., 180 in FIG. 1) labelled "out" in FIG. 2.

Hysteresis feedback stage 230 is an example of a portion of comparator 200 that selectively provides hysteresis current to the current mirrors. Hysteresis switch devices NE35 and PE34 are controlled by the output node of comparator 200. In an example of the basic operation of the hysteresis circuit, when an input signal is applied to input inp and has a voltage level that is less than an input signal applied to input inn, the comparator output is low, e.g., logic 0, and transistor PE34 conducts a current αI which is added to the input currents at node 215 of the NMOS cascode current mirror. When the voltage level of the signal at inp rises to be equal to the voltage level of the signals at inn, the currents added to the cascode current mirrors (both the NMOS and the PMOS) are no longer equal because the added current increases the currents in transistors NE7 and NE8 by αI, making the net output current equal to αI if the output were not saturated at the lower supply voltage. Therefore, the output node remains at the lower supply until additional current from transistor PE9 overcomes the total current from transistor NE9.

Under these conditions, voltage of the signal applied at inp must rise above the voltage applied at inn sufficiently to overcome the offset added by the current of transistor PE34. This voltage is nominally equal to the current of transistor PE34 divided by the transconductance of the differential input stage formed by transistors PE2, PE3, NE2, and NE3. When voltage of the signal at inp rises to this level, then the output switches from a low to a high state, turning off transistor PE34 and turning on transistor NE35. When this occurs, the current added at node 215 is gone and an identical current αI of opposite polarity from transistor NE35 is added at node 205 of the PMOS cascode current mirror. The net result of this current is that an additional current αI is added to transistors PE7 and PE10 and the input offset has reversed polarity.

Now as the voltage of the input signal inp is lowered to equal the voltage of the input signal at inn, the net output current is/from the positive supply to the output, so the voltage of the signal at inp must be lowered sufficiently to overcome the offset current. The switching of these added currents defines the hysteresis.

Figure 3A:
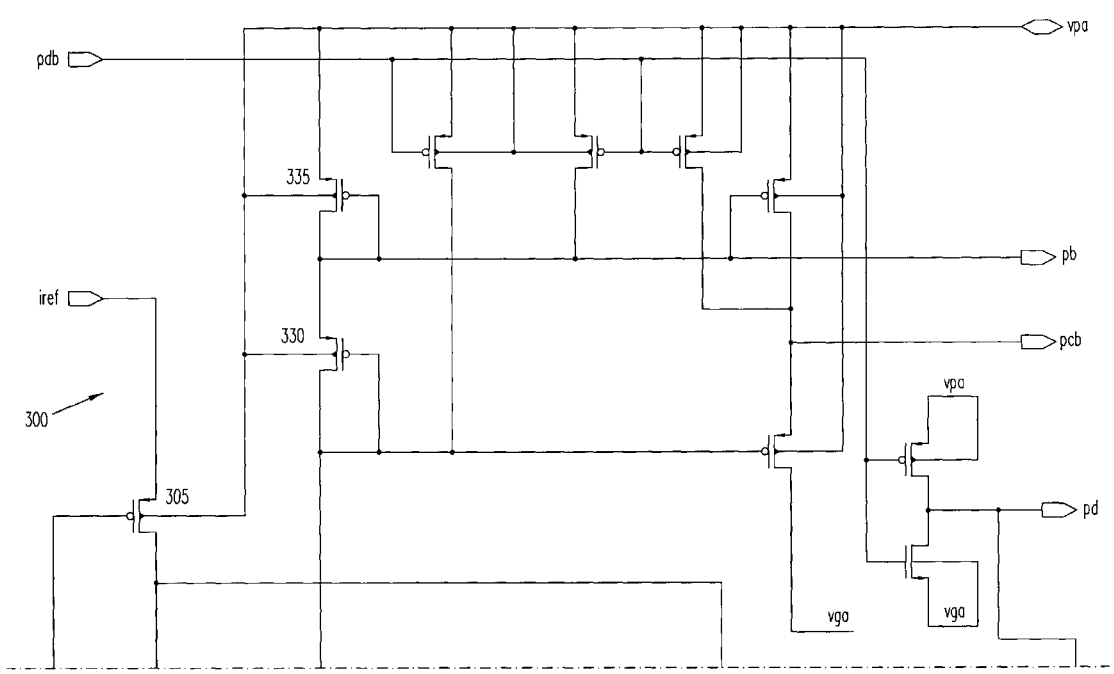
FIG. 3 (shown as FIGS. 3A–3B) illustrates a simplified schematic diagram of bias circuitry used to bias current controlling elements of circuits like those shown in FIGS. 1 and 2.
Figures 3, 3A, 3B:
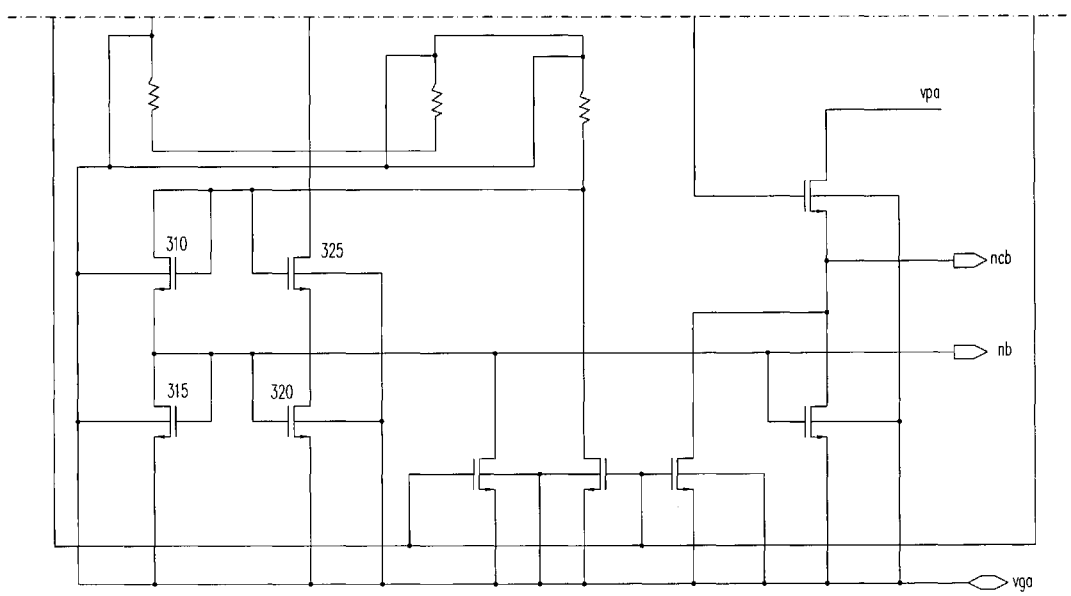

Hysteresis feedback stage 230 also includes current source transistors NE14 and PE28 that act as the current starving devices. Current sources transistors NE14 and PE28 are typically designed to be identical in size to differential input pair current source transistors NE1 and PE1 except for their relative ratios, which is set by a multiplier parameter m. Bias currents in comparator 200 are set by one or more bias circuits in which the reference devices are nominally identical in size to bias current devices but with a different multiplier value. FIG. 3 illustrates bias circuitry used to bias current controlling elements of comparator 200 and will be described in greater detail below. Since the currents supplied to the differential input pairs and the hysteresis circuit are derived from the same bias voltages, e.g., voltages supplied at pb and nb, they track each other meaning that current in the hysteresis circuit follows the transconductance of the input stage to provide a stable hysteresis.

More specifically, current source transistors NE1 and PE1 are set to help maintain constant transconductance of the input stage for all operating conditions. For rail-to-rail operation, the operating conditions include circuit states where: (1) both the PMOS differential input pair (transistors PE2 and PE3) and the NMOS differential input pair (transistors NE2 and NE3) are active; (2) only the PMOS differential input pair is active; or only the NMOS differential input pair is active. The constant transconductance input stage provides that for an offset voltage of Δv the net output current is ΔI which is constant over the entire input voltage range. Accordingly, a constant current flowing through either PE34 or NE35 of the hysteresis feedback stage 230 and added to the currents from the differential input pairs input pairs currents will effectively add an input offset voltage equal to the hysteresis current divided by the net transconductance of the input stage. The hysteresis currents are based on equal currents in the bias circuit, and so the hysteresis currents are equal and the hysteresis is symmetrical. Moreover, since the hysteresis currents are biased from the same voltage as the input-pair bias currents, the hysteresis currents also track the input-pair bias currents and the the constant transconductance of the input stage keeps the hysteresis constant over variations in semiconductor manufacturing process and input voltage. The hysteresis provided by hysteresis feedback stage 230 is typically nearly constant over temperature except for transconductance variation of the differential input pairs over temperature versus a fixed current.

The hysteresis functionality of comparator 200 can be selectively enabled or disabled using appropriate control transistors. For example, transistors PE33 and NE34 are control devices which enable and disable the hysteresis circuit, driven by an enabling signal applied to the hy_en input and the inverter formed by NE36 and PE35. Still other techniques for enabling and disabling the hysteresis functionality will be understood by those having ordinary-skill in the art. Additional features associated with the hysteresis can also be implemented. For example, the magnitude of the hysteresis currents avaialble can be made programmable. In still other examples, the hysteresis can be designed to be asymetric.

FIG. 3 illustrates a simplified schematic diagram of bias circuitry used to bias current controlling elements of circuits like those shown in FIGS. 1 and 2. Bias circuit 300 can be considered to include several bias circuits because it produces the biasing voltages pb (used by the PMOS differential input pair and the PMOS current starving transistor PE28), pcb (used by the PMOS cascode current mirror), nb (used by the NMOS differential input pair and the NMOS current starving transistor NE14), and ncb (used by the NMOS cascode current mirror) all of which are derived from a reference current source iref.

The input current to bias circuit 300 at input node iref is typically derived from another circuit which provides a current proportional to a voltage reference which is stable over temperature, voltage and process. The proportionality is established by a trimmed resistor, which ensures the required accuracy. The voltage reference is typically a bandgap voltage, which is familiar to all those having skill in the art. Bias circuit 300 is controlled by input signal pdb. Signal pdb is inverted at node pd to provide true and false powerdown controls to multiple comparators and to disable/enable the bias circuit. When the bias circuit is enabled, the gate of transistor 305 is low, allowing the reference current at node iref to become the drain current in transistors 310 and then 315. Since transistor currents scale with the ratio of sizes, which also means the ratio of the number of devices for substantially identically-sized devices, the drain currents in transistors 320 and 325 are one half the input current at iref. The drain current of transistor 325 provides bias current to PMOS devices 330 and 335. The voltages established between the drain of transistor 315 and the lower supply voltage vga and between the drain of transistor 335 and the upper supply voltage vpa define the bias voltages for NMOS and PMOS current sources in the comparators.

Since the input current at iref, and therefore the currents in transistors 315 and 335, is virtually constant over temperature, supply voltage, and process, the currents in the bias circuit are also virtually constant. The net effect of bias circuit 300 in evaluating the design of comparator 200 is that, because the NMOS transistor 315 size in the bias circuit is substantially identical to the NMOS transistor sizes of comparator transistors whose gates are biased at the nb node voltage, the currents are scaled as the number of replications of identical structures. Similarly the size matching of PMOS transistor sizes for those gates biased at the pb node to the bias circuit transistor 335 dictate that the currents are scaled as the number of replications of identical structures.

The cascode bias level for NMOS and PMOS cascode devices in the comparator is typically set such that the cascode current mirror operation does not degrade due to transistors falling out of their saturation region. If the cascode bias voltage is too low, the current mirror transistors PE7 and PE10 or NE7 and NE8 will be biased in the linear region instead of in the desired saturation region. If the cascode bias voltage is too high the cascode transistors PE8 and PE9 or NE4 and NE9 will be biased in the linear region. Either case degrades circuit performance, causing mismatches in the currents between transistors where proper operation requires matched currents. At very low temperature, the gate-source voltage of the cascode transistors PE8, PE9, NE4 and NE9 increase, which can result in a reduction of the drain-source voltage at any of the transistors PE7, PE10, NE7 and NE8 to the point of dropping into the linear region. At very high temperatures the drain-source saturation voltage of transistors PE7, PE10, NE7 and NE8 will increase, which can also force operation in the linear region. The design of bias circuit 300 ensures that these conditions are avoided. Although this goal can also be achieved by substitution of resistors for transistors 310 and 330, the required resistors impose an expensive area penalty which should be avoided in cost-efficient design.

The comparators described herein can find use as dedicated integrated circuit comparators, or as parts of other integrated circuits. In one embodiment, a comparator such as comparator 100 or 200 is included as part of a programmable analog integrated circuit. Analog integrated circuits typically use some type of programmable analog circuit block architecture that permits change in one or more functions of the analog circuit without changing the topology of the circuit elements, thereby reducing changes in voltage offset and distortion created by changes in topology and making configuration or reconfiguration simpler for users.

Figure 4:
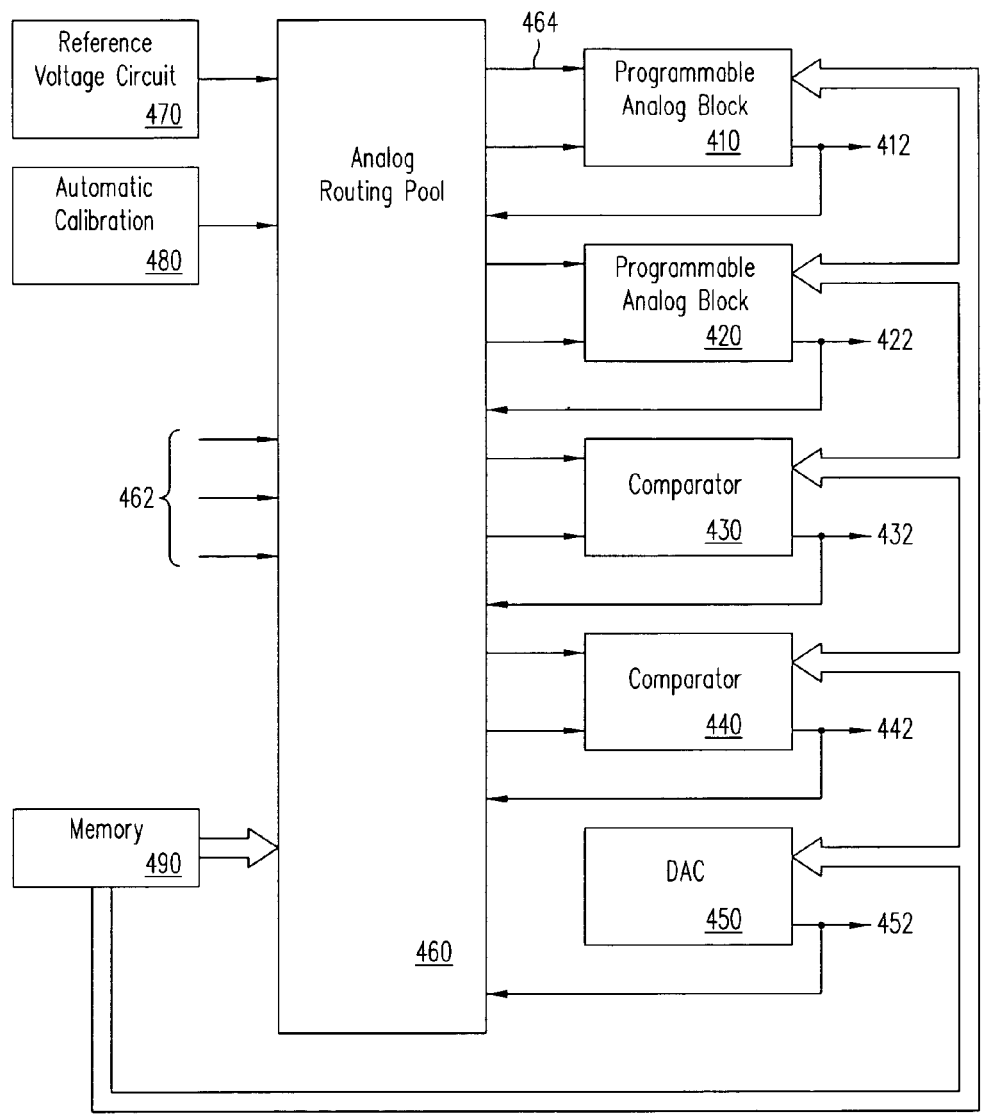
FIG. 4 is a simplified block diagram of a programmable analog integrated circuit including two comparators like those described in FIGS. 1 and 2.

FIG. 4, illustrates a programmable analog integrated circuit 400 including two programmable analog circuit blocks 410 and 420, two comparator blocks 430 and 440 (e.g., based on the comparator designs described above), a digital-to-analog converter (DAC) 450, and an analog routing pool 460. Programmable analog integrated circuit 400 also includes support circuitry coupled to interconnect array 460, such as voltage reference circuit 470, power-on auto-calibration circuitry 480, and configuration memory 490. Single ended or differential input signals 462 are received by analog routing pool 460, and can be routed to any of programmable analog circuit blocks 410 and 420, comparator blocks 430 and 440, and external output terminals (not shown), depending upon the programming of analog routing pool 460. Analog routing pool 460 also controls the routing of the output signals of each of the programmable analog circuit blocks 410 and 420, comparator blocks 430 and 440, differential output DAC 450, and external output terminals.

The routing of the analog routing pool is determined by information stored in memory 490. More specifically, individual bits stored within memory 490 control whether individual switches of analog routing pool 460 are on or off. Memory 490 also stores similar information for programming the programmable analog circuit blocks 410 and 420, the comparators 430 and 440, and DAC 450.

Memory 490 can be implemented using both non-volatile and volatile memories, such as static read only memory, dynamic random access memory, static random addressable memory, shift registers, electronically erasable ($E^2$) memory, and flash memory. Reference voltage circuit 470 provides a stable voltage reference, e.g., 2.5 V, to analog routing pool 460 for use throughout programmable analog integrated circuit 400.

Programmable analog circuit blocks 410 and 420 can include operational amplifiers, resistors, capacitors, and other basic analog circuit elements. Examples of typical programmable analog circuit blocks 410 and 420 can be found in U.S. Pat. No. 5,574,678, entitled "Continuous Time Programmable Analog Block Architecture," by James L. Gorecki, (the "Gorecki patent") which is incorporated herein by reference in its entirety. In general, programmable analog circuit blocks 410 and 420 flexibly implement basic analog circuit functions such as precision filtering, summing/differencing, gain/attenuation, and integration.

Programmable analog circuit blocks 410 and 420 can be implemented as single-ended circuit blocks, although in some embodiments, they are fully differential from input to output. Note that for simplicity in FIG. 4 (as well as FIG. 5), each of input signals 462, each of the two input signals to programmable analog circuit blocks 410 and 420, each of the two input signals to comparator blocks 430 and 440, and each of the output signals 412, 422, 432, 442, and 152 are shown as single lines, even though they each may represent either a singled ended signal or a differential signal pair. The circuits illustrated can be implemented with fully differential circuit pathways in some embodiments, although single-ended operation is possible by design, by programming, or via conversion circuits at the input and output nodes. Differential architecture substantially increases dynamic range as compared to single-ended I/O, while affording improved performance with regard to circuit specifications such as common mode rejection and total harmonic distortion. Moreover, differential operation affords added immunity to variations in the circuit's power supply.

Automatic calibration circuit 480 is used to calibrate circuit elements of programmable analog integrated circuit 400, such as programmable analog circuit blocks 410 and 420. Typically, a calibration mode is initiated by, for example, a circuit power on signal (i.e., anytime the circuit is turned on) or by a specific calibrate command signal that allows calibration to be requested at any time. In one embodiment, simultaneous successive approximation routines (SAR) are used to determine the amount of offset error referred to each of the output amplifiers used in programmable analog circuit blocks 410 and 420. That error is then nulled by a calibration DAC for each output amplifier. The calibration constant can be stored in memory 490, but is preferably recomputed each time programmable analog integrated circuit 400 enters a calibration mode.

In many applications using comparators, it is desirable to compare a signal to a known reference. This can be accomplished with programmable analog integrated circuit 400 in a variety of ways. For example, a reference signal can be coupled to one of the inputs 462, and subsequently routed to one or both of the comparators 430 and 440 via analog routing pool 460. Similarly, an output signal from one of the programmable analog circuit blocks 410 and 420 can be routed to one or both of the comparators 430 and 440 via analog routing pool 460. Finally, DAC 450 can be programmed to produce a analog signal that is routed to one or both of the comparators 430 and 440 via analog routing pool 460.

Figure 5:
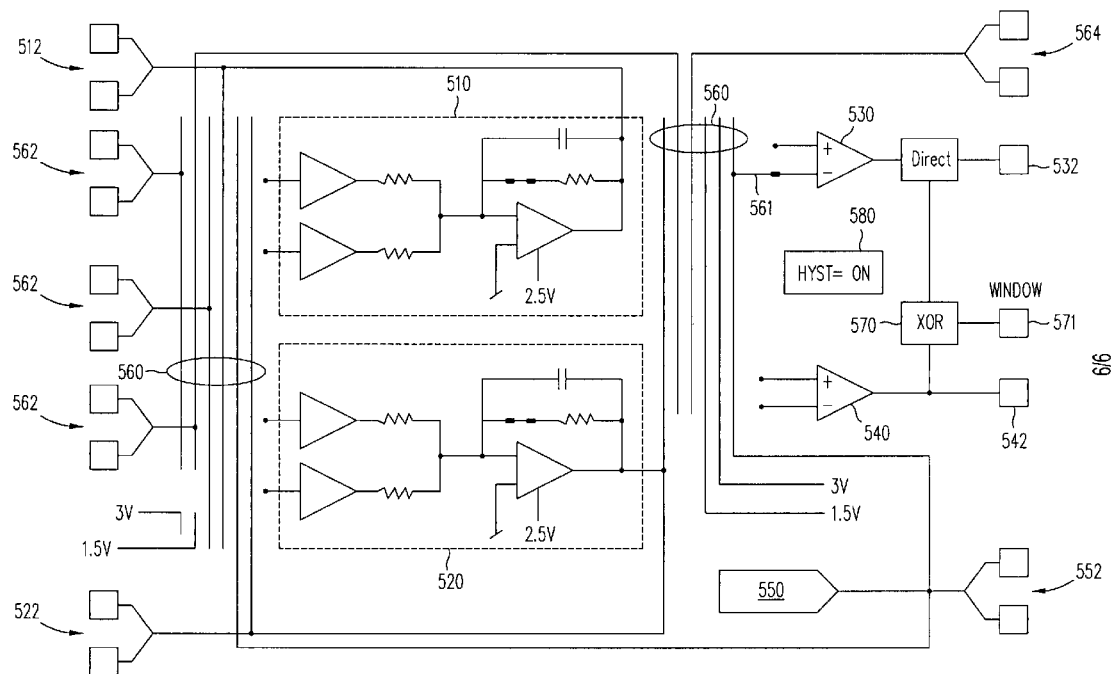
FIG. 5 illustrates functional components of a programmable analog integrated circuit, and the possibilities for interconnecting those components.

FIG. 5 illustrates functional components of a programmable analog integrated circuit, and the possibilities for interconnecting the components. Additionally FIG. 5 is an example of the software-based graphical user interface that can be used to program programmable analog integrated circuits, such as that shown in FIG. 4. For example, the analog routing pool of FIG. 4 is schematically represented by, among other things, wiring lines 560. Programming a connection through the analog routing pool utilizing software-based graphical user interface is illustrated by line 561 which joins one of the inputs of comparator 530 with the output of DAC 550. Similarly various input terminals 562 and 564 can be coupled to input terminals of programmable analog circuit blocks 510 and 520 and comparators 530 and 540.

Thus, in the embodiment illustrated in FIG. 5, all inputs to the comparators 530 and 540 can be accessed from several different points including signals external to the programmable analog integrated circuit. When first shown to a user of the software-based graphical user interface, the inputs to the comparators appear not to be connected to any signal source. However, when no connection chosen, the differential input terminals for the comparators can be connected to an internal DC reference voltage. Thus, if one of the input terminals of comparator 530 was left unconnected, by the user, the differential voltage on that input would be 0V. Consequently, any positive voltage on the other input of comparator 430 would result in a logic 1 output, and any negative voltage a logic 0.

Comparators 530 and 540 can be used together to perform other functions such as windowing. For example, providing appropriate window limit signals (e.g., an upper voltage limit and a lower voltage limit) to respective inputs of comparator 530 and 540 will result in a symmetrical window for comparison purposes. The signal to be compared to the window is then applied to the other comparator inputs. Additionally, the WINDOW pin 581 (window compare output pin) which is the output terminal for the exclusive OR logic 570 coupled between the two output terminals of comparators 530 and 540, provides the appropriate logic signal depending upon whether the input signal is "inside" or "outside" the window.

Still another programming option typically provided to a user is the ability to enable or disable (580) the aforementioned comparator hysteresis. Hysteresis is useful in situations where a slow moving signal, or an uncertain transition condition exists that would otherwise result in excessive noise on the comparator output. FIG. 5 is merely illustrative of some of the features and programmability of an example of programmable analog integrated circuit, and those having ordinary skill in the are will readily recognize different configurations and programmability options to achieve different analog circuit applications.

Regarding terminology used herein, it will be appreciated by one skilled in the art that any of several expressions may be equally well used when describing the operation of a circuit including the various signals and nodes within the circuit. Any kind of signal, whether a logic signal or a more general analog signal, takes the physical form of a voltage level (or for some circuit technologies, a current level) of a node within the circuit. Such shorthand phrases for describing circuit operation used herein are more efficient to communicate details of circuit operation, particularly because the schematic diagrams in the figures clearly associate various signal names with the corresponding circuit blocks and node names.

While the disclosed devices and techniques have been described in light of the embodiments discussed above, one skilled in the art will recognize that certain substitutions may be easily made in the circuits without departing from the teachings of this disclosure. For example, a variety of logic gate structures may be substituted for those shown, and still preserve the operation of the circuit, in accordance with DeMorgan's law. Also, many circuits using NMOS transistors may be implemented using PMOS transistors instead, as is well known in the art, provided the logic polarity and power supply potentials are reversed. In this vein, the transistor conductivity-type (i.e., N-channel or P-channel) within a CMOS circuit may be frequently reversed while still preserving similar or analogous operation.

The disclosed devices and techniques are not limited by any transistor or capacitor sizes or by voltage levels disclosed herein. Moreover, implementation of the disclosed devices and techniques is not limited by CMOS technology, and thus implementations can utilize NMOS, PMOS, bipolar or other technologies.

Although the present invention has been described with respect to a specific preferred embodiment thereof, various changes and modifications may be suggested to one skilled in the art and it is intended that the present invention encompass such changes and modifications that fall within the scope of the appended claims.

What is claimed is:

1. A comparator comprising;
   an input amplifier including:
      a first pair of input transistors having a first transistor type, each of the first pair of input transistors being coupled to a corresponding input terminal operable to receive a respective input signal;
      a second pair of input transistors having a second transistor type, each of the second pair of input transistors being coupled to a respective one of the corresponding input terminals;
   a first current mirror coupled to the first pair of input transistors and operable to sum a first pair of input amplifier output signals and provide at least a portion of a comparator output signal on a comparator output terminal;
   a second current mirror coupled to the second pair of input transistors and operable to sum a second pair of input amplifier output signals and provide at least another portion of the comparator output signal on the comparator output terminal;
   a first hysteresis transistor including a first hysteresis transistor input terminal coupled to the comparator output terminal and operable to supply a first hysteresis current to at least one of the first current mirror and the second current mirror; and
   a second hysteresis transistor including a second hysteresis transistor input terminal coupled to the comparator output terminal and operable to supply a second hysteresis current to at least one of the first current mirror and the second current mirror.

2. The comparator of claim 1, wherein the comparator is integrated within a programmable analog integrated circuit.

3. The programmable analog integrated circuit of claim 2, wherein the integrated circuit comprises:
- a plurality of analog circuit blocks;
- a plurality of comparators; and
- an analog routing pool coupled to the analog circuit blocks and comparators.

4. A comparator comprising;
an input amplifier including:
- a first pair of input transistors having a first transistor type, each of the first pair of input transistors being coupled to a corresponding input terminal operable to receive a respective input signal;
- a second pair of input transistors having a second transistor type, each of the second pair of input transistors being coupled to a respective one of the corresponding input terminals;

a summing stage coupled to the input amplifier and operable to sum input amplifier output signals and provide a comparator output signal on a comparator output terminal, wherein the summing stage comprises:
- a first current mirror coupled to the first pair of input transistors and operable to sum a first pair of input amplifier output signals and provide at least a portion of the comparator output signal on the comparator output terminal; and
- a second current mirror coupled to the second pair of input transistors and operable to sum a second pair of input amplifier output signals and provide at least another portion of the comparator output signal on the comparator output terminal; and a hysteresis feedback stage coupled to the comparator output terminal and operable to supply a hysteresis current to the summing stage.

5. The comparator of claim 4, wherein the hysteresis stage comprises:
- a first hysteresis transistor including a first hysteresis transistor input terminal coupled to the comparator output terminal and operable to supply a first hysteresis current to the summing stage; and
- a second hysteresis transistor including a second hysteresis transistor input terminal coupled to the comparator output terminal and operable to supply a second hysteresis current to the summing stage.

6. The comparator of claim 4, wherein the comparator is integrated within a programmable analog integrated circuit.

7. The programmable analog integrated circuit of claim 6, wherein the integrated circuit comprises:
- a plurality of analog circuit blocks;
- a plurality of comparators; and
- an analog routing pool coupled to the analog circuit blocks and comparators.

8. A comparator comprising;
an input amplifier;
a summing stage including:
- a first current mirror coupled to the input amplifier and operable to sum a first pair of input amplifier output signals and provide at least a portion of the comparator output signal on a comparator output terminal; and
- a second current mirror coupled to the input amplifier and operable to sum a second pair of input amplifier output signals and provide at least another portion of the comparator output signal on the comparator output terminal; and a hysteresis feedback stage coupled to the comparator output terminal and operable to supply a hysteresis current to the summing stage.

9. The comparator of claim 8, wherein the hysteresis stage comprises:
- a first hysteresis transistor including a first hysteresis transistor input terminal coupled to the comparator output terminal and operable to supply a first hysteresis current to at least one of the first current mirror and the second current mirror of the summing stage; and
- a second hysteresis transistor including a second hysteresis transistor input terminal coupled to the comparator output terminal and operable to supply a second hysteresis current to at least one of the first current mirror and the second current mirror of the summing stage.

10. The comparator of claim 8, wherein the comparator is integrated within a programmable analog integrated circuit.

11. The programmable analog integrated circuit of claim 10, wherein the integrated circuit comprises:
- a plurality of analog circuit blocks;
- a plurality of comparators; and
- an analog routing pool coupled to the analog circuit blocks and comparators.

* * * * *